United States Patent
Mohammad et al.

(10) Patent No.: US 10,355,380 B1
(45) Date of Patent: Jul. 16, 2019

(54) PIN THROUGH SOLDER INTERCONNECT AND METHODS

(71) Applicant: Intel Corporation, Santa Clara, CA (US)

(72) Inventors: Feroz Mohammad, Chandler, AZ (US); Srinivasa Aravamudhan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 15/938,110

(22) Filed: Mar. 28, 2018

(51) Int. Cl.
*H01R 12/52* (2011.01)
*H05K 7/20* (2006.01)
*H01R 12/72* (2011.01)
*H01R 12/71* (2011.01)

(52) U.S. Cl.
CPC ........... *H01R 12/52* (2013.01); *H01R 12/716* (2013.01); *H01R 12/722* (2013.01); *H05K 7/2039* (2013.01)

(58) Field of Classification Search
CPC .... H01R 12/52; H01R 12/716; H01R 7/2039; H01R 12/722
USPC .......................................................... 361/760
See application file for complete search history.

(56) References Cited

U.S. PATENT DOCUMENTS 6,121,576 A * 9/2000 Hembree ............. B23K 1/0053
219/209
2016/0338199 A1* 11/2016 Hua ........................ H01R 12/52

* cited by examiner

*Primary Examiner* — Sherman Ng
(74) *Attorney, Agent, or Firm* — Schwegman Lundberg & Woessner, P.A.

(57) ABSTRACT

An electronic device that includes a first electronic component with a pin element and a second electronic component with a solder element. A joint is formed that provides an electrical and mechanical connection between the first electronic component and second electronic component when the pin element is heated, inserted into the solder element, and cooled.

19 Claims, 6 Drawing Sheets

PIN THROUGH SOLDER INTERCONNECT AND METHODS

TECHNICAL FIELD

This document pertains generally, but not by way of limitation, to electronic devices, including manufacturing electronic devices. More specifically, this document pertains to providing improved interconnections when forming electronic devices.

BACKGROUND

Manufacturing components for computing devices involves rigorous manufacturing processes that involve placing, or connecting electronic components together to establish mechanical and electrical connections. Such electronic components include mother boards, integrated circuits (ICs), chips, memory devices, modern processors, such as a central processing unit (CPU), a graphics processing unit (GPU), advanced processing unit (APU), or combinations thereof, and the like.

When electronic components are manufactured, numerous electrical and mechanical characteristics are considered to create a viable product. Characteristics include, but are not limited to, physical damage, mechanical vibrations, thermal properties, electrical properties such as electric and magnetic fields, electrostatic discharge, package form and size, product loading, power delivery, signal integrity, and the like. These characteristics may be improved by not only improving individual components, but also by improving mechanical and electrical connections between the electronic components.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
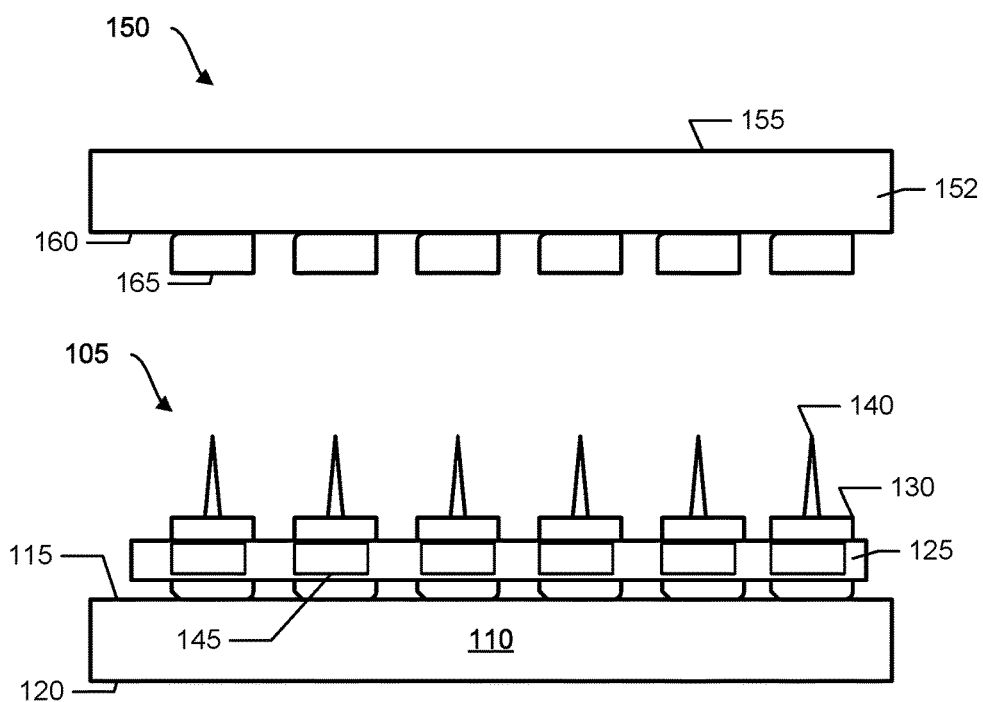
FIG. 1 is a side plan view of an unconnected electronic device in accordance with an example embodiment.

When forming electronic devices, such as computing devices, micro-computing devices and the like, the interconnection between different electronic components to a board, such as a mother board, is key to providing a quality end product. Typically electronic components such as integrated circuits (ICs), chips, chip sets, memory devices, modern processors, such as a central processing unit (CPU), a graphics processing unit (GPU), advanced processing unit (APU), or combinations thereof, and the like are sold individually as a unit to a manufacturer that then connects numerous components to a mother board for a final product.

Currently, there are several methods that are used to connect electronic components having a high pin count to a board. These methods include: 1. solder ball reflow in a surface mount technology oven to create electrical contact between the component pads and motherboard pads, typically in flip chip ball grid array packages; 2. wave-soldering to a mother board as done with dual in-line memory modules; 3. providing gold surfaces mechanically mated with each other through a sustained load as is commonly done with socket interconnections.

The two soldering techniques provide a permanent joint between the electronic components and the motherboard to provide a mechanical and electrical connection. Still, when an electronic component needs to be removed from the board, the permanent connection prevents such removal. Thus, replacement and reconnection is difficult.

Meanwhile, mechanical mating is accomplished through a retention loading mechanism. Such loading mechanisms may include cantilever beam contacts, cantilever springs, or other such mechanisms providing a force to form the interconnection. Thus, unlike the permanent joint connection of the solder techniques, these connections provide a replaceable connection points. Still, the mechanical mating techniques are inflexible, provide reduced signal performance and power, and are expensive to manufacture. Additionally, to accommodate the loading mechanism, some devices require hex and square pin patterns, resulting in additional design constraints.

Provided herein, in one example, is a manufacturing method and electronic devices where a motherboard includes an array pin elements interconnected to corresponding solder elements of an electronic component without using soldering or loading techniques described above. Instead, in the example, the pin elements are placed over an interconnect surface of the motherboard and solder elements are placed over an interconnect surface of the electronic component. The pin elements are then heated to a threshold temperature based on the material of the solder elements. After heating, the pin elements are inserted into the corresponding solder elements.

In one example, pin elements are heated above the threshold temperature of each corresponding solder element to ensure when contacted, a pin element reflows the corresponding solder element at the point of contact to result in insertion of the pin element into the solder element. After the pin element is at a desired depth, or position, the pin element and solder element cool, solidifying melted solder material and forming a metallurgical joint between the pin element and corresponding solder element.

In another example, when separation of the interconnected components is desired, such as when an electronic component needs to be removed from a board, the pin elements are reheated, causing reflow of solder material surrounding the pin elements to allow separation of the electronic components. Because the solder element only reflows at the point of contact with the pin element, minimal deformation of the solder element occurs, allowing for reuse of the solder element for an additional interconnection.

Because of this interconnect technique, the pin elements utilized are not required to be stamped metal contacts or required to be made of gold, greatly reducing costs compared to mechanically mating surfaces with a retention loading mechanism. Without the requirements of a loading mechanism, reduced motherboard dimensions may also be achieved. Specifically, because pin elements are placed as desired, rigid hex and square patterns are no longer necessary. This results in up to a 20% reduction in package form factors, socket form factors, and pin element count, in addition to reduced package height.

Additionally, by eliminating the loading mechanism, previous limitations resulting from system stiffness, contact working range, and other similar limitations resulting from loading contacts are eliminated. Without such limitations, pin count scalability and pitch scalability are both improved.

The technique may also form a device with improved signal integrity as a result of a straight contact between the pin elements and solder elements compared to devices using loading mechanisms. Signal integrity may also be improved because the devices manufactured using this technique include ground referencing in sockets that are PCB based. Also compared to interconnections using loading mechanisms, improved power delivery may be provided as a result of a reduced resistance path (Rpath) resulting from the metallurgical joint compared to a mechanical type of interconnect.

Figure 2:
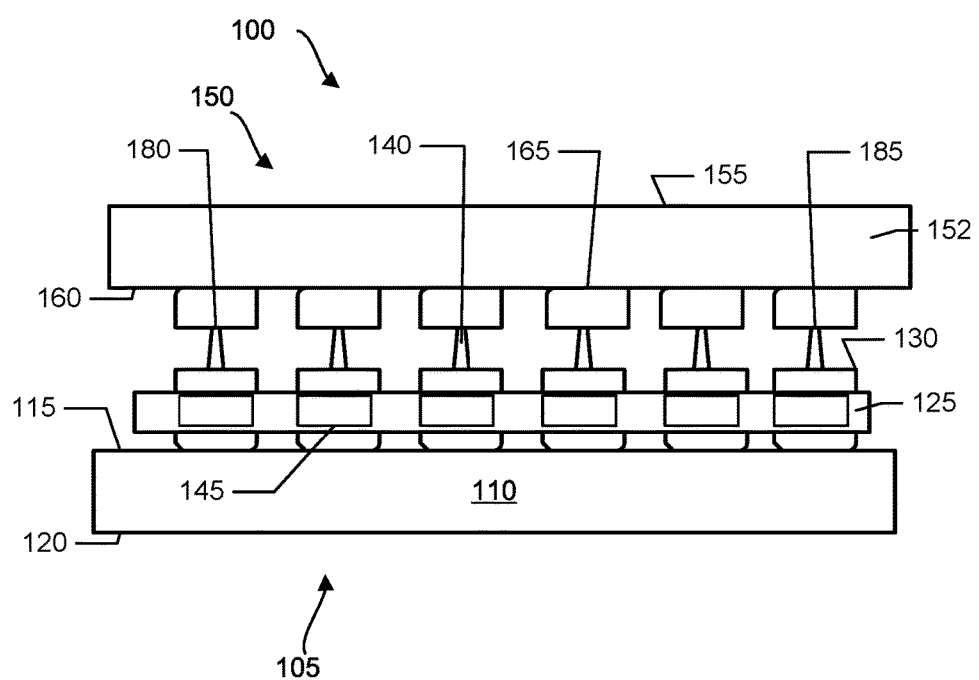
FIG. 2 is a side plan view of a connected electronic device in accordance with an example embodiment.

FIGS. 1-2 illustrate an example electronic device 100 in accordance with one example of the invention. The electronic device 100 includes a first electronic component 105 that in an example is a board, such as a motherboard. While the first electronic component 105 may receive only one other electronic component as provided in FIGS. 1-2, in other embodiments, the first electronic component 105 receives multiple other additional electronic components. Such additional electronic components may be connected to the first electronic component through similar methodologies as described herein, or through other interconnection methodologies without falling outside of this disclosure.

The first electronic component 105 includes a substrate 110 having top and bottom surfaces 115 and 120. An interposer 125 includes a plurality of sockets 130 surface mounted to the top surface 115 of the substrate 110. Each socket 130 includes a pin element 140. Typically, each pin element 140 is centrally located in each corresponding socket 130.

A heating element 145 is coupled to the electronic device 100 to convey or transfer heat to either the pin element 140, a corresponding solder element 165, or joint 185 formed between the pin element 140 and solder element 165. The heating element 145 in one example, is a heating trace embedded in the substrate 110, or other component of the electronic device 100 adjacent sockets 130. In other embodiments, the heating element contacts, or engages the pin element or solder element. Alternatively, when operated, the heating element moves to comes in contact with the pin element 140 or solder element 165. The heating element may heat by resistive heating, inductive heating, or the like. In this manner, when heat is required to facilitate insertion of the pin element 165 in the solder element 165, or removal of the pin element 140 from the solder element 165, heat is conveyed or transferred to the pin element 140, solder element 165, joint 185, or combination of one or more.

A second electronic component 150 also includes a substrate 152 having top and bottom surfaces 155 and 160. The second electronic component may include, but is not limited to a processor, CPU, GPU, APU, chip set, IC, memory device, or the like. The second electronic component 150 includes a plurality of solder elements 165 on its bottom surface 160. The solder elements 165 are of any type, including, but not limited to solder balls, solder pads, solder bumps, solder columns, and the like.

Each solder element 165 is made of a material that has a melting point that is less than the melting point of the material of the pin elements 140. Specifically, when connection is desired, the pin elements 140 are heated, either via heating traces 145 embedded in the pin mounted substrate 110, inductive heating, or the like. Once heated above a threshold temperature, that in an example is the melting point of the solder material of the solder elements 165, the pin elements 140 are inserted into the solder elements 165 at a point of contact 180.

At the point of contact 180, the pin element 140 engages the solder element causing local reflow of the solder material. The pin element 140 tunnels into the solder element 165 until a desired position of the pin element 140 within the solder element 165 is achieved. Because of the use of the heated pin element 140, the solder element 165 is only deformed locally, directly adjacent the pin element, leaving the remaining material of the solder element 165 intact. In an example, less than 50% of the solder element melts. In another example, only solder material engaging, or in direct contact with, the pin element 140 is melted. Once the pin element 140 is at a desired position, heat is no longer transferred to the pin element, allowing the pin element to cool. In an example, the time above solder liquidus is between 60 and 90 seconds. Consequently, the melted solder material surrounding the pin element 140 cools to below the threshold temperature. Below the threshold temperature the solder material solidifies around the pin element 140 providing a metallurgical joint 185 to form the interconnected device 100 as provided in FIG. 2.

Figure 3:
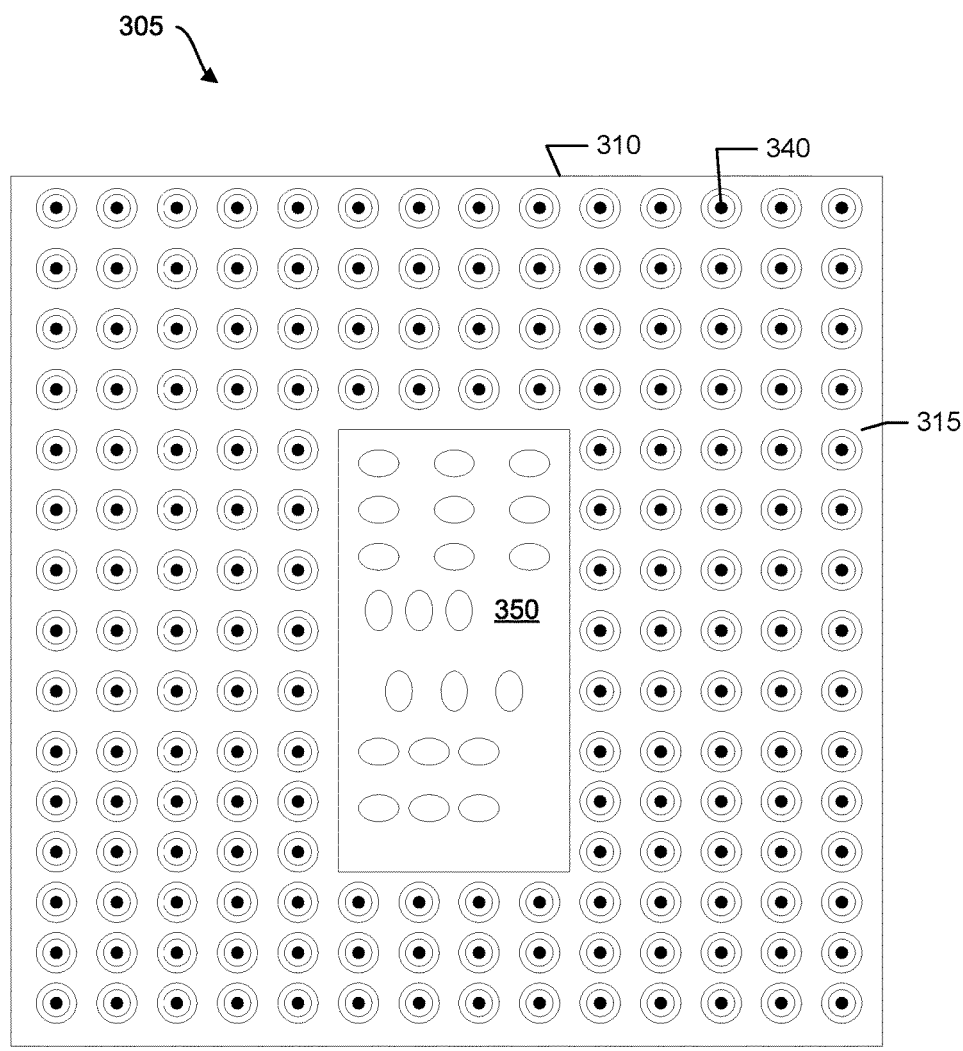
FIG. 3 is a top plan view of an electronic component of an electronic device in accordance with an example embodiment.

FIG. 3 illustrates a top view of an example motherboard 305, that may be the first electronic component 105 of FIGS. 1-2. The motherboard 305 includes a substrate 310 with a top surface 315 that has an array of sockets 330 mounted thereto. Each socket includes a pin element 340 similar to the electronic component 105 of FIGS. 1-2. As illustrated by FIG. 3 the pin elements 340 are located at any place on the motherboard 305 without limitation, and allow for interconnection with a second electronic component 350. The second electronic component 350 in an example is the second electronic component 150 of FIGS. 1-2.

In the example of FIG. 3, pin elements 340 are presented in an array spread evenly across the substrate 310 in spaced, side-by-side relation with one another. While a pattern, such as a hex or square pattern, may be provided, such patterns are unnecessary. Specifically, the accommodation of a retention mechanism is not required; consequently, pin elements 340 are placed to minimize the dimensions, and form, of the substrate 310 resulting in pin count reduction, package size reduction, simplification, and standardization of the manufacturing process.

Figure 4:
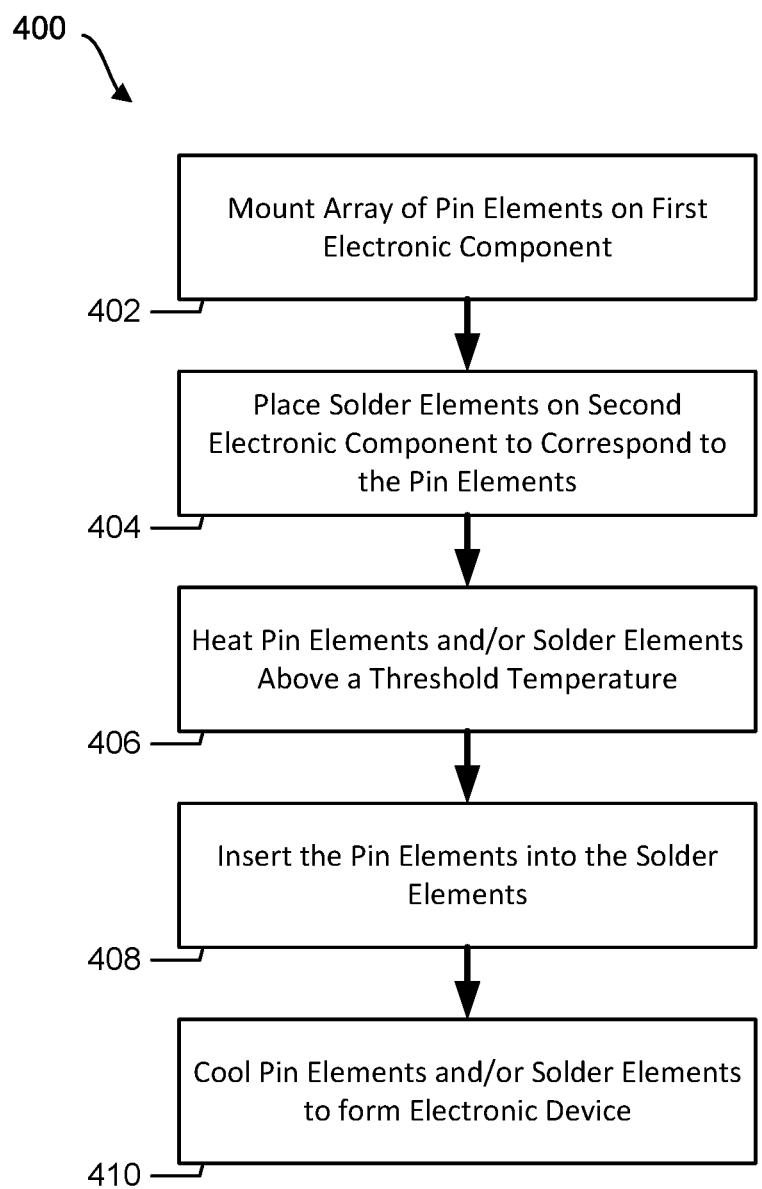
FIG. 4 is a block flow diagram of a method of manufacturing an electronic device in accordance with an example embodiment.

FIG. 4 illustrates an example method of manufacturing an electronic device 400. The electronic device in one example is the electronic device 100 illustrated in FIG. 2. At 402, an array of pin elements are mounted onto a first electronic component. The first electronic component in one example is similar to the first electronic component 105 of FIGS. 1-2. In another example the first electronic component is a mother board similar to the motherboard 305 of FIG. 3. In another example, sockets are mounted to a substrate of the first electronic component and each socket includes a pin element. At 404, solder elements are placed on a surface of a second electronic component that correspond, or are spaced and positioned to align with the pin elements of the first electronic component. The second electronic component in an example is the second electronic component 150 illustrated in FIGS. 1-2, or discussed in relation to FIG. 3. The second electronic component is of any type that may be connected to a motherboard, including but not limited to a processor, CPU, GPU, APU, chip set, IC, memory device, or the like. The solder elements are also of any type, including, but not limited to solder ball, solder pads, solder bumps, and solder columns. The solder elements are made of a material having a melting point that is less than the melting point of the pin elements.

At 406, the pin elements are heated above a threshold temperature. The pin elements are heated through any method, including but not limited to resistive heating heater traces embedded in the pin mounted substrate, inductive heating, or the like. The threshold temperature in one example is the melting point of the solder material of the solder elements. At 408, after heating the pin elements above the threshold temperature, the pin elements are inserted into corresponding, or aligned, solder elements. Because the pin elements are above the threshold temperature, reflow occurs at the point of contact between the pin elements and the solder elements. At 410, the heat is no longer transferred to the pin elements to cool the melted solder material surrounding the pin elements. Thus, a joint is formed between the first and second electronic components, and an electronic device is formed.

In one example, a metallurgical joint is formed because of the solder material solidifying between the pin element and solder element. Therefore, a straight mechanical and electrical connection is formed between the first and second electrical components. The connection provides improved signal integrity over connections requiring mechanical force to maintain a connection such as requiring a cantilever beam in a land grid array socket connection. Similarly, this pin through solder connection also provides a reduced resistance path (Rpath) compared to mechanical force based interconnections.

Figure 5:
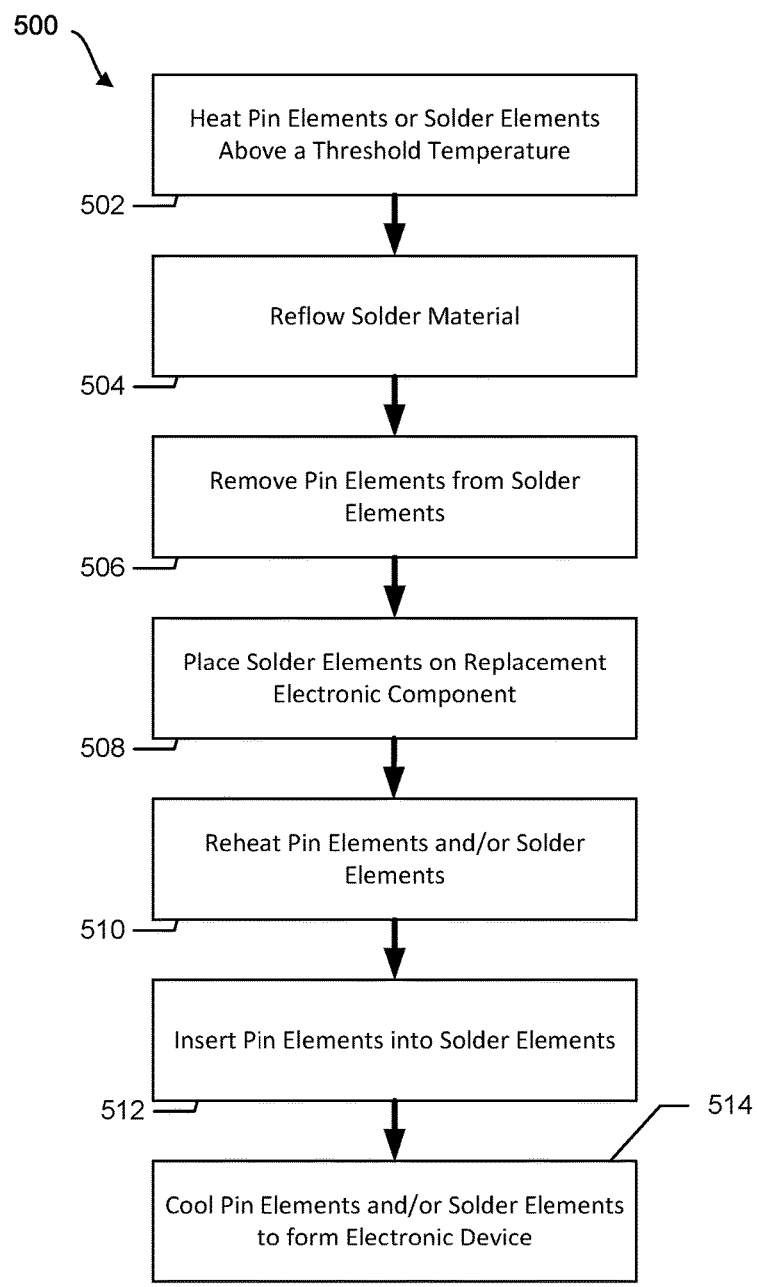
FIG. 5 is a block flow diagram of a method of replacing an electronic component of an electronic device in accordance with an example embodiment.

FIG. 5 illustrates a method for replacing an electronic component from interconnection with a board, such as a motherboard 500. The electronic device in an example is the electronic device 100 illustrated in FIG. 2 and the board in examples include the first electronic component 105, or motherboard 305. The second electronic component in an example includes the second electronic component 150 of FIGS. 1-2. At 502, pin elements of the board are heated to be above a threshold temperature. The pin elements are heated in any manner, including, but not limited to heat traces adjacent the pin elements, induction heating, heating of a solder element in which the pin is inserted, or the like.

At 504, solder material surrounding the pin elements reflows because of being heated by the pin elements. At 506, after reflow around the pin elements, the pin elements are removed from the solder element. At 508 solder elements are placed on a surface of a third, or replacement electronic component, including but not limited to a processor, CPU, GPU, APU, chip set, IC, memory device, or the like. The solder elements include, but are not limited to solder balls, solder pads, solder bumps, and solder columns. The solder elements are each positioned to correspond to a pin element of the board. At 510, the pin elements are reheated in any manner previously discussed, again above the threshold temperature. Alternatively, the pin elements remain heated and continue exceeding the threshold temperature from being heated at step 502.

At 512, the pin elements are inserted into the corresponding solder elements of the replacement electronic component. Because the pin elements are above the threshold temperature, reflow occurs at the point of contact between the pin elements and the solder elements. At 514, the heat is no longer transferred to the pin elements to cool the pin element to form a joint between the pin element and solder element. This results in the forming of the electronic device including the replacement electronic component.

As a result of the pin through solder interconnection technique a metallurgical joint is formed as a result of the solder material solidifying between the pin element and solder element. Yet, unlike previous soldering techniques, the electronic components are able to be separated from one another by merely reheating the pin elements. This permits practical removal of an electronic component that have a failure, no longer functions properly, or needs to be upgraded. Thus, when a motherboard with multiple electronic components has only one of the components go bad, replacement of the entire motherboard is not required. This saves significant cost and reduces unneeded destruction of properly functioning components.

In multiple experiments, the interconnection insertion and removal techniques were verified as providing mechanical and electrical interconnection, even after multiple iterations of removal and connection between a pin element and solder element. In a first experiment, a single pin element and corresponding solder element was provided. The solder element was a solder ball with solder material 57Bi42Sn1Ag having a melting point of approximately 139° C. and a 24-mil diameter. The pin element was heated above the 139° C. melting point temperature into a range between 150-160° C. and inserted into the solder element with the time above solder liquidus being 60-90 seconds. Local reflow at the point of contact occurred without significant deformity to the solder ball apart from the point of contact. Specifically, less than 50% of the solder element was deformed. After insertion the pin element was cooled below the melting point. The pin element and solder element were observed and analyzed to identify the formation of intermetallic compounds to indicate mechanical and electrical connection between the pin element and solder element. The pin element was then heated above the melting point temperature and removed from the solder element. Again, the solder element was observed. This cycle of insertion and removal was repeated resulting in insertion and removal five (5) times.

From this first experiment, while at each insertion and removal step the solder ball became more and more deformed, formation of intermetallic compounds successfully occurred during each iteration. Thus, for each insertion, a successful electrical and mechanical connection was achieved.

In a second experiment, a motherboard having pin elements similar as discussed in relation to FIGS. 1-3 received an electronic component also similar as described in relation to FIGS. 1-3. Thus, an array of pin elements was provided on the motherboard with corresponding solder elements on the electronic component. Like the first experiment the solder elements were solder balls with solder material 57Bi42Sn1Ag having a melting point of approximately 139° C. and a 24-mil diameter. The pin elements were heated above the 139° C. melting point temperature into a range between 150-160° C. and inserted into the solder elements with the time above solder liquidus being 60-90 seconds. Local reflow at the point of contact occurred without significant deformity to the solder ball apart from the point of contact.

In the second experiment, the pin elements were inserted into the solder elements four times and removed three times.

From observation, based on the pin element solder coverage and solder ball deformity, additional removals and insertions were not attempted. Still, for the pin element size of the second experiment, removal and insertion was accomplished for several iterations providing an improved device and techniques for interconnection between two electronic components and specifically a motherboard and an electronic component.

Figure 6:
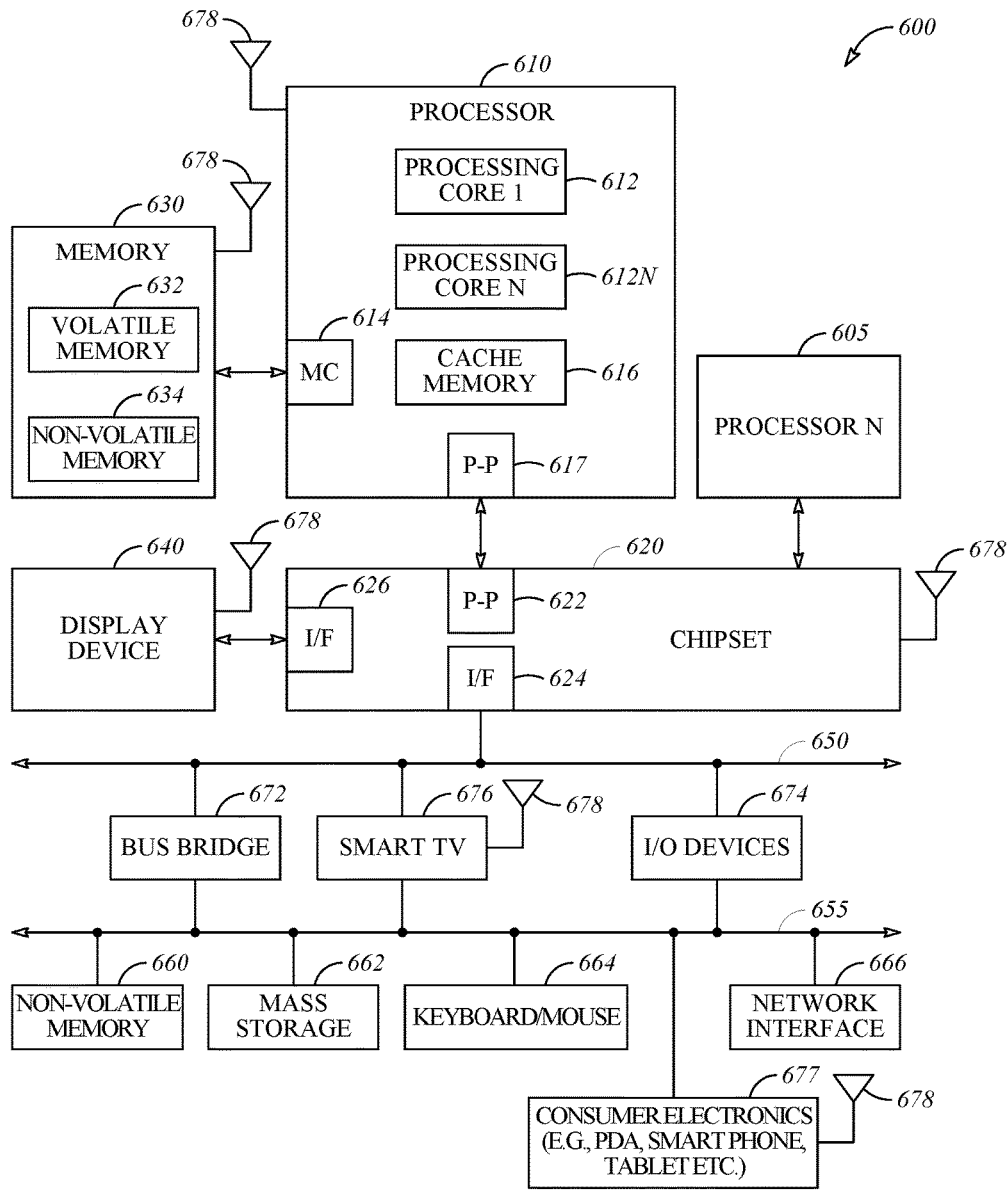
FIG. 6 is a block flow diagram of example devices in accordance with an example embodiment in accordance with an example embodiment.

FIG. 6 illustrates a system level diagram, depicting an example of an electronic system including CPUs and processors, graphics devices, memories, and the like, any one of which may be an example of the second electronic component 150 of FIGS. 1-2 to be placed on a first electrical component such as the first electrical component 105 or motherboard 305 of FIGS. 1-3. FIG. 6 is included to show an example of a higher level device application for the electronic device 100, first electronic component, 105, motherboard 305, and second electronic component 150 as described in the present disclosure. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

VARIOUS NOTES & EXAMPLES

Example 1 is an electronic device comprising: a first electronic component including a pin element; a second electronic component including a solder element; a joint electrically and mechanically connecting the first electronic component and second electronic component and formed between the pin element of the first electronic component and the solder element of the second electronic component;

and a heating element coupled to the electronic device to transfer heat to at least one of the pin element, solder element, or joint.

In Example 2, the subject matter of Example 1 optionally includes wherein the heating element is embedded within the first electronic component.

In Example 3, the subject matter of Example 2 optionally includes wherein the heating element is a heating trace.

In Example 4, the subject matter of Example 3 optionally includes wherein the heating trace transfers heat to at least one of the pin elements through resistive heating.

In Example 5, the subject matter of any one or more of Examples 1-4 optionally include wherein the solder element surrounds the pin element.

In Example 6, the subject matter of any one or more of Examples 1-5 optionally include wherein the first electronic component is a motherboard that comprises a socket mounted on a substrate, said socket including the pin element.

In Example 7, the subject matter of Example 6 optionally includes wherein the second electronic component is a memory device.

In Example 8, the subject matter of any one or more of Examples 1-7 optionally include wherein the pin element is within an array of pin elements positioned across a surface of the first electronic component.

In Example 9, the subject matter of Example 8 optionally includes wherein the pin elements of the array of pin elements are evenly spaced across the surface of the first electronic component.

Example 10 is an electronic device comprising: a motherboard including a socket with a pin element mounted to a substrate; an electronic component including a solder element corresponding to the pin element; and a joint coupling the motherboard and electronic component and formed between the pin element of the motherboard and the solder element of the second electronic component; and a heating trace embedded in the electronic device to transfer heat to at least one of the pin element, solder element, or joint.

In Example 11, the subject matter of Example 10 optionally includes wherein the joint provides an electrical and mechanical connection between the pin element and solder element.

In Example 12, the subject matter of any one or more of Examples 10-11 optionally include wherein the pin element is one of an array of pin elements extending across the first electronic component.

In Example 13, the subject matter of Example 12 optionally includes wherein the array of pin elements form a pattern across the first electronic component.

In Example 14, the subject matter of any one or more of Examples 10-13 optionally include wherein the solder element is within in a ball grid array of solder elements.

In Example 15, the subject matter of any one or more of Examples 10-14 optionally include wherein the electronic component is a dual in-line memory module.

Example 16 is a method of interconnecting electronic components comprising steps: heating a pin element of a first electronic component; inserting the pin element into a solder element of a second electronic component to reflow the solder element at a point of contact between the pin element and solder element; and forming a joint between the pin element and solder element upon solidification of the solder element after insertion of the pin element.

In Example 17, the subject matter of Example 16 optionally includes wherein the first electronic component includes a socket with the pin element.

In Example 18, the subject matter of any one or more of Examples 16-17 optionally include wherein heating the pin element comprises heating the pin element with a heating element coupled to the first electronic component.

In Example 19, the subject matter of Example 18 optionally includes wherein the heating element is a trace embedded in the first electronic component.

In Example 20, the subject matter of any one or more of Examples 16-19 optionally include wherein heating the pin element comprises inductive heating of the pin element.

In Example 21, the subject matter of any one or more of Examples 16-20 optionally include wherein the first electronic component is a motherboard.

In Example 22, the subject matter of Example 21 optionally includes wherein the second electronic component is a memory device.

In Example 23, the subject matter of any one or more of Examples 16-22 optionally include after forming the joint, heating the pin element above a threshold temperature; after heating the pin element above the threshold temperature, separating the second electronic component from the first electronic component; while the pin element is above the threshold temperature, inserting the pin element into a solder element of a third electronic component; and forming a joint between the pin element of the first electronic component and solder element of the third electronic component.

In Example 24, the subject matter of Example 23 optionally includes reheating the pin element to above the threshold temperature before inserting the pin element into the solder element of the third electronic component.

In Example 25, the subject matter of any one or more of Examples 16-24 optionally include after forming the joint, heating the pin element above a threshold temperature; after heating the pin element above the threshold temperature, separating the second electronic component from the first electronic component; while the pin element is above the threshold temperature, reinserting the pin element into the solder element of the second electronic component; and reforming the joint between the pin element of the first electronic component and the solder element of the second electronic component upon solidification of the solder element of the second electronic component.

Each of these non-limiting examples may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed:

1. An electronic device comprising: a first electronic component including a pin element, wherein the first electronic component is a motherboard that comprises a socket mounted on a substrate, said socket including the pin element; a second electronic component including a solder element; a joint electrically and mechanically connecting the first electronic component and second electronic component and formed between the pin element of the first electronic component and the solder element of the second electronic component; a heating element coupled to the electronic device to transfer heat to at least one of the pin element, solder element, or joint; wherein the heating element is embedded within the first electronic component, and wherein the heating element is a heating trace.

2. The device of claim 1, wherein the heating trace transfers heat to at least one of the pin elements through resistive heating.

3. The device of claim 1, wherein the solder element surrounds the pin element.

4. The device of claim 1, wherein the second electronic component is a memory device.

5. The device of claim 1 wherein the pin element is within an array of pin elements positioned across a surface of the first electronic component.

6. The device of claim 5 wherein the pin elements of the array of pin elements are evenly spaced across the surface of the first electronic component.

7. An electronic device comprising: a motherboard including a socket with a pin element mounted to a substrate; an electronic component including a solder element corresponding to the pin element; and a joint coupling the motherboard and electronic component and formed between the pin element of the motherboard and the solder element of the second electronic component; and a heating trace embedded in the electronic device to transfer heat to at least one of the pin element, solder element, or joint.

8. The device of claim 7 wherein the joint provides an electrical and mechanical connection between the pin element and solder element.

9. The device of claim 7 wherein the pin element is one of an array of pin elements extending across the first electronic component.

10. The device of claim 9 wherein the array of pin elements form a pattern across the first electronic component.

11. The device of claim 7 wherein the solder element is within in a ball grid array of solder elements.

12. The device of claim 7 wherein the electronic component is a dual in-line memory module.

13. A method of interconnecting electronic components comprising steps: heating a pin element of a first electronic component, wherein the first electronic component includes a socket with the pin element; inserting the pin element into a solder element of a second electronic component to reflow the solder element at a point of contact between the pin element and solder element; forming a joint between the pin element and solder element upon solidification of the solder element after insertion of the pin element, wherein heating the pin element comprises heating the pin element with a heating element coupled to the first electronic component, and wherein the heating element is a trace embedded in the first electronic component.

14. The method of claim 13 wherein heating the pin element comprises inductive heating of the pin element.

15. The method of claim 13 wherein the first electronic component is a motherboard.

16. The method of claim 15 wherein the second electronic component is a memory device.

17. The method of claim 13 further comprising: after forming the joint, heating the pin element above a threshold temperature; after heating the pin element above the threshold temperature, separating the second electronic component from the first electronic component; while the pin element is above the threshold temperature, inserting the pin element into a solder element of a third electronic component; and forming a joint between the pin element of the first electronic component and solder element of the third electronic component.

18. The method of claim 17 further comprising: reheating the pin element to above the threshold temperature before inserting the pin element into the solder element of the third electronic component.

19. The method of claim 13 further comprising: after forming the joint, heating the pin element above a threshold temperature; after heating the pin element above the threshold temperature, separating the second electronic component from the first electronic component; while the pin element is above the threshold temperature, reinserting the pin element into the solder element of the second electronic component; and reforming the joint between the pin element of the first electronic component and the solder element of the second electronic component upon solidification of the solder element of the second electronic component.

* * * * *